United States Patent [19]

Tracy et al.

[11] 4,241,108

[45] Dec. 23, 1980

[54] SPRAYABLE TITANIUM COMPOSITION

[75] Inventors: Chester E. Tracy, South River; Werner Kern, Belle Mead; Robert D. Vibronek, Sayreville, all of N.J.

[73] Assignee: RCA Corporation, New York, N.Y.

[21] Appl. No.: 950,167

[22] Filed: Oct. 10, 1978

[51] Int. Cl.[2] .......................... C08K 5/05; B05D 1/02; B05D 5/06; B05D 3/02
[52] U.S. Cl. ............................... 427/162; 106/287.19; 427/160; 427/164; 427/168
[58] Field of Search ............... 427/160, 162, 164, 168; 106/287.19

[56] References Cited

U.S. PATENT DOCUMENTS

| 3,017,282 | 1/1962 | Brill | 106/287.19 |
| 3,460,956 | 8/1969 | Dahle | 106/287.19 X |

*Primary Examiner*—James R. Hoffman
*Attorney, Agent, or Firm*—H. Christoffersen

[57] ABSTRACT

The addition of 2-ethyl-1-hexanol to an organometallic titanium compound dissolved in a diluent and optionally containing a lower aliphatic alcohol spreading modifier, produces a solution that can be sprayed onto a substrate and cured to form an antireflection titanium oxide coating having a refractive index of from about 2.0 to 2.2.

11 Claims, No Drawings

SPRAYABLE TITANIUM COMPOSITION

The invention described herein was made in the performance of work under NASA Contract Number NAS-7-100, JPL-954868 and is subject to the provisions of Section 305 of the National Aeronautics and Space Act of 1958, Public Law 85-568 (72 Stat. 435; 42 U.S.C. 2457).

This invention relates to a sprayable composition for applying a titanium oxide film and method for applying same. More particularly, this invention relates to a composition which can be sprayed and reacted so as to form an antireflection coating of titanium oxide having a refractive index of from about 2.0 to 2.2.

BACKGROUND OF THE INVENTION

The application of antireflective coatings to substrates such as solar cells and glass, for example, has heretofore been done by applying a titanium film by vacuum deposition, sputtering and the like and heating to oxidize the film. These processes are expensive and unsuitable for continuous mass production techniques. Recently, more direct methods have been disclosed for applying such coatings by dipping in a solution, or, in the case of small substrates, by spinning on a solution, and then baking or curing to oxidize the film. These methods, which reduce the cost greatly from methods which require a vacuum chamber and expensive equipment, are essentially batch type processes. A spray process, whereby sheets of glass or solar cells can be continuously and controllably sprayed with a titanium compound, would be much less expensive and amenable to a continuous, mass production line operation.

However, the application of an antireflection coating for solar cells, for example, has several very stringent requirements; the refractive index of the film must be in the range of about 2.0 to 2.2; a uniform film of about 700 angstroms thickness must adhere strongly to the substrate; and the film must be stable on prolonged exposure to strong sunlight.

In order to prepare a solution for spray application, it must be made of miscible components; the solution must thoroughly and uniformly wet the surface of the substrate; it must flow uniformly across the substrate surface and coalesce, to form a thin, continuous, and homogeneous liquid film of uniform thickness on the substrate; it must have a viscosity compatible with the available orifice size of the spray nozzle and pressure range of the equipment employed; and the solution should be non-toxic and low in cost. In addition, after oxidation of the film, the final coating must have good adhesion and good integrity to the substrate, must be reasonably uniform in thickness over the entire surface of the substrate, be free of haze and gross structural imperfections, be stable and have the required thickness and refractive index. Presently known solutions for spinning or dipping titanium compounds onto a substrate cannot be employed successfully in spray equipment because they do not spread evenly across the substrate surface, thus building up or depleting areas, particularly on the periphery of the substrate or along elevated lines, such as metallization grids; because they may form turbid solutions; or because the resultant titanium oxide films are non-uniform or hazy.

SUMMARY OF THE INVENTION

We have found that the addition of 2-ethyl-1-hexanol solvent to an organometallic titanium compound in a diluent and, optionally, a lower aliphatic alcohol as a spreading, modifying agent produces a solution that can be sprayed uniformly and controllably onto the substrate and cured or oxidized to form an antireflection coating having a refractive index of from about 2.0 to 2.2.

DETAILED DESCRIPTION OF THE INVENTION

The sprayable composition of the invention includes an organometallic titanium compound, a miscible ester diluent therefor, 2-ethyl-1-hexanol, and (optionally) a lower aliphatic alcohol spreading, modifying agent.

Suitable organometallic titanium compounds include soluble titanium compounds which are hydrolyzable and can be readily oxidized and stabilized at temperatures below about 400° C. to form adherent and uniform, titanium oxide films which have a refractive index of from about 2.0 to 2.2. The preferred titanium compounds at the present time are titanium alkoxide compounds such as titanium isopropoxide and titanium ethoxide.

The titanium compound is dissolved or diluted initially with an inert ester diluent such as butyl acetate, ethyl acetate and the like to form a one-phase solution. Suitably, the titanium compound is admixed in a ratio of about 1:2 to 1:4 by volume, preferably 1:3 by volume, with the eser diluent.

A lower aliphatic alcohol can then be added if desired. Suitable lower alcohols include ethanol, isopropanol, or n-propanol. The alcohol, when admixed with the titanium solution, should be one that is completely miscible with the diluent and the titanium compound; has the requisite surface tension so that it will form a uniform liquid film on a substrate, one that promotes wetting the surface of the substrate completely, particularly with substrates having metal patterns, to spread the liquid film evenly along the surface of the substrate between metal lines; and one that has a vapor pressure so that it evaporates slowly enough so that the liquid film is not disrupted during the evaporation. The presence of an alcohol is not required, but it is desirable, especially in the case of solar cells with metallization grids.

The 2-ethyl-1-hexanol appears to be unique in that when admixed with the other composition ingredients, it has the ability to effect spreading of the solution evenly across the substrate, improve wetting, improve the uniformity of evaporation of the solvent so that a uniform film can be applied to the substrate and dried to form a uniform continuous film of a titanium compound on the substrate.

The spray solution ingredients are mixed in such proportions that the resultant solution can be applied evenly using spray techniques to form a liquid film of a desired thickness. The exact proportions can be varied within some limits, although the 2-ethyl-1-hexanol should be present in at least about 33 percent by volume of the spray solution. A maximum of about 33 percent by volume of the lower aliphatic alcohol will be present.

As is known, a silicon compound can reduce the refractive index of titanium oxide films and silicon compounds are known to be present in spin applied solutions. However, no silicon compounds are required for the present sprayable solutions and process to apply antireflective coatings to glass and solar cells, although a compound such as an alkoxysilicate can be added if desired to the spray solution. Wetting agents can also be added to the spray solution but are not required to obtain a uniform thin film along the total surface of the substrate.

The solution as described above is sprayed onto the desired substrate so as to obtain the desired thickness of the finished coating. The rate of spraying can be varied to change the thickness of the applied films, or spraying can be repeated for attaining thicker films. Alternatively, machine parameters (such as spray pressure, delivery pressure, spray gun height above substrate, or spray gun traverse speed) can be varied to modify the film thickness. Automated vapor-carried-spray equipment, such as manufactured by the Zicon Corporation, has been found to be suitable for spraying the present solution.

The next step in preparing the present coatings is to air dry the spray film to remove the bulk of the volatile solvents, and then heating at higher temperatures so as to react and oxidize the titanium compound to a stable solid film of titanium oxide.

We have found that the heating rate and temperature must be controlled in order to obtain the desired titanium antireflective coating. Initially the spray film should be heated at a temperature of about 70° C. for at least 30 seconds to remove the solvents but without disrupting the film. This can be conveniently accomplished by passing the sprayed film through an infrared furnace. The titanium compound film is then heated for at least about 30 seconds at a temperature of about 200° C. and finally for at least about 30 seconds at a temperature of about 350° to 400° C. The film can be heated thus in three separate stages, or may be heated gradually starting at a temperature of from about 70° C. and increasing the temperature in a continuous manner up to about 400° C. Higher maximum temperatures, up to about 500° C. will not harm the film providing the substrate does not soften or distort at the maximum temperature employed.

The invention will be further illustrated by the following Examples although the invention is not to be limited to the details described therein.

EXAMPLE 1

One hundred milliliters of titanium isopropoxide was admixed with 300 milliliters of n-butyl acetate. One hundred milliliters of this solution was then stirred together with 100 milliliters of isopropanol and 100 milliliters of 2-ethyl-1-hexanol.

The above solution was passed through a 1 μm filter to remove particulates and was then sprayed onto chromium metallized glass plates, chemically cleaned, polished single-crystal silicon slices, and metallized single-crystal silicon solar cells using a Zicon Corporation automatic sprayer having an orifice size of 0.31 millimeter, a spray pressure of 172 kPa, spray gun speed of 36 cm/sec, while maintaing the spray head at a height of about 10 centimeters above the substrate. Dry nitrogen was used as the ambient atmosphere during the spraying process.

The substrate was then heated first at about 70° C. in an infrared furnace for about 1 minute, then at 200° C. for 1 minute and then at 400° C. for 1 minute, all in air.

The resultant titanium oxide film had a uniform thickness of about 670 angstroms and a refractive index of 2.064, as measured by ellipsometry at a wavelength of 5461 angstroms.

EXAMPLE 2

The procedure of Example 1 was repeated except substituting titanium ethoxide as a titanium compound. Similar results were obtained.

EXAMPLE 3

The process of Example 1 was followed except using ordinary Pyrex-type glass plates as the substrate. An excellent antireflective coating was obtained.

We claim:

1. A composition comprising:
   an organometallic titanium compound,
   an inert miscible ester diluent therefore, and 2-ethyl-1-hexanol in proportions such that the composition is sprayable to form a uniform film on a substrate.

2. The composition according to claim 1 wherein said organometallic titanium compound is a titanium alkoxide.

3. A composition according to claim 2 wherein said titanium alkoxide is titanium isopropoxide.

4. A composition according to claim 2 wherein said titanium alkoxide is titanium ethoxide.

5. A composition according to claim 1 wherein said ester diluent is butyl acetate.

6. A composition according to claim 1 which additionally contains a lower aliphatic alcohol modifier.

7. A composition according to claim 6 wherein said lower alcohol is isopropanol.

8. A mehod of applying a uniform thin antireflection coating of titanium oxide on a substrate which comprises:
   spraying a composition comprising an organometallic titanium compound, an inert miscible ester diluent therefore, and 2-ethyl-1-hexanol onto said substrate,
   drying said composition to remove said diluent and said 2-ethyl-1-hexanol by evaporation,
   heating the resultant film in air at an initial temperature at about 70° C. and a final temperature of 350° to 400° C.,
   whereby a film of titanium oxide is formed on said substrate having a refractive index of from 2.0 to 2.2.

9. A method according to claim 8 wherein said spray composition additionally contains a lower aliphatic alcohol modifier.

10. A method according to claim 8 or 9 wherein said temperature is increased in a stepwise manner whereby said film-covered substrate is heated at 70° C. for at least about 30 seconds, then at about 200° C. for at least about 30 seconds and finally at a temperature of about 400° C. for at least about 30 seconds.

11. A method according to claim 8 or 9 wherein said substrate is a silicate glass.

* * * * *